United States Patent
Lee et al.

(10) Patent No.: US 12,207,372 B2
(45) Date of Patent: Jan. 21, 2025

(54) ELECTRONIC DEVICE WITH HOUSING FOR GENERATING LIGHT EFFECT

(71) Applicant: ASUSTEK COMPUTER INC., Taipei (TW)

(72) Inventors: Yiwei Lee, Taipei (TW); Chun-Mao Tseng, Taipei (TW); Lu-Chien Chen, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 17/836,113

(22) Filed: Jun. 9, 2022

(65) Prior Publication Data

US 2023/0131617 A1 Apr. 27, 2023

(30) Foreign Application Priority Data

Oct. 27, 2021 (TW) ................................ 110139788

(51) Int. Cl.
*H05B 47/155* (2020.01)

(52) U.S. Cl.
CPC .................. *H05B 47/155* (2020.01)

(58) Field of Classification Search
CPC .................................................... H05B 47/155
See application file for complete search history.

(56) References Cited

U.S. PATENT DOCUMENTS

| | | | | |
|---|---|---|---|---|
| 8,081,430 B2* | 12/2011 | Weber | .................. | G06F 1/1656 |
| | | | | 361/679.02 |
| 8,240,903 B2* | 8/2012 | Wu | ........................ | G09F 13/18 |
| | | | | 362/628 |
| 8,854,801 B2* | 10/2014 | Bergeron | .............. | G06F 1/1616 |
| | | | | 361/679.01 |
| 10,084,501 B1* | 9/2018 | Coverstone | ........... | G06F 3/0412 |

(Continued)

FOREIGN PATENT DOCUMENTS

| CN | 303738973 S | 7/2016 |
|---|---|---|
| CN | 106189490 A | 12/2016 |

(Continued)

OTHER PUBLICATIONS

Machine Translation of JP-5115168-B2 (Year: 2013).*
Matthew Hogan, EIC Search Report, Jun. 28, 2024, STIC (Year: 2024).*

*Primary Examiner* — Raymond R Chai
(74) *Attorney, Agent, or Firm* — Muncy, Geissler, Olds & Lowe, P.C.

(57) ABSTRACT

An electronic device is provided. The electronic device includes a housing, a first light-emitting module, a second light-emitting module, and a control unit. The housing includes a first light-emitting region and a second light-emitting region. The first light-emitting module includes a plurality of first light-emitting units arranged in the first light-emitting region in an array, and the first light-emitting unit includes a light-emitting ink layer. The second light-emitting module is disposed in the second light-emitting (Continued)

region. The control unit is electrically connected to the first light-emitting module and the second light-emitting module, and generates a first light-emitting signal and a second light-emitting signal in response to an instruction, to respectively control the first light-emitting module and the second light-emitting module to emit light.

8 Claims, 11 Drawing Sheets

(56) References Cited

U.S. PATENT DOCUMENTS

| | | | | |
|---|---|---|---|---|
| 11,036,454 | B2* | 6/2021 | Clark | G06F 1/3265 |
| 11,315,444 | B2* | 4/2022 | Li | G09F 21/00 |
| 11,551,591 | B2* | 1/2023 | Peterson | H05B 45/10 |
| 11,991,902 | B2* | 5/2024 | Kim | H10K 71/621 |
| 2009/0196032 | A1* | 8/2009 | Hsu | G09F 13/14 |
| | | | | 362/231 |
| 2010/0038225 | A1* | 2/2010 | Furuoya | H01H 13/83 |
| | | | | 200/314 |
| 2010/0238667 | A1* | 9/2010 | Wu | G02B 6/006 |
| | | | | 362/310 |
| 2013/0169545 | A1* | 7/2013 | Eaton | G06F 1/1649 |
| | | | | 345/173 |
| 2013/0222736 | A1* | 8/2013 | Qi | G06F 1/1637 |
| | | | | 362/602 |
| 2013/0255116 | A1* | 10/2013 | Kaoh | G09F 13/22 |
| | | | | 40/563 |
| 2014/0286008 | A1* | 9/2014 | Hack | H05B 45/60 |
| | | | | 29/592.1 |
| 2015/0185408 | A1* | 7/2015 | Hsu | H04B 1/3888 |
| | | | | 362/614 |
| 2015/0312884 | A1* | 10/2015 | Kharitonov | H04M 19/04 |
| | | | | 455/412.2 |
| 2017/0134065 | A1* | 5/2017 | Cramer | F21V 29/70 |
| 2017/0205854 | A1* | 7/2017 | Zenoff | G06F 1/1639 |
| 2017/0322368 | A1* | 11/2017 | Seo | G02B 6/002 |
| 2018/0314370 | A1* | 11/2018 | Large | G06F 3/04883 |
| 2020/0264661 | A1* | 8/2020 | Kim | G06F 1/1628 |
| 2022/0026947 | A1* | 1/2022 | Ju | H04M 1/026 |
| 2023/0033752 | A1* | 2/2023 | Schoeck | G06F 1/1615 |

FOREIGN PATENT DOCUMENTS

| | | |
|---|---|---|
| CN | 108153055 B | 8/2020 |
| CN | 108089386 B | 2/2021 |
| CN | 112445407 A | 3/2021 |
| JP | 5115168 B2 * | 1/2013 |

* cited by examiner

ELECTRONIC DEVICE WITH HOUSING FOR GENERATING LIGHT EFFECT

CROSS-REFERENCE TO RELATED APPLICATION

This application claims the priority benefit of Taiwan application serial No. 110139788, filed on Oct. 27, 2021. The entirety of the above-mentioned patent application is hereby incorporated by reference herein and made a part of the specification.

BACKGROUND OF THE INVENTION

Field of the Invention

The disclosure relates to an electronic device, and in particular, to an electronic device generating a light emitting effect on a housing.

Description of the Related Art

To highlight the distinctness of the product, light-emitting patterns are generally decorated on a housing of an electronic device. However, for conventional electronic devices, holes need to be formed on the housing, and corresponding light sources are disposed inside to form the light-emitting patterns. Such holes affect the integrity of the housing. In addition, light-emitting forms provided by the conventional electronic devices are limited and cannot present diversified light emitting effects.

BRIEF SUMMARY OF THE INVENTION

The disclosure provides an electronic device. The electronic device includes a housing, a first light-emitting module, a second light-emitting module, and a control unit. The housing includes at least a first light-emitting region and a second light-emitting region. The first light-emitting module includes a plurality of first light-emitting units arranged in the first light-emitting region in an array, and the first light-emitting unit includes a light-emitting ink layer. The second light-emitting module is disposed in the second light-emitting region. The control unit is electrically connected to the first light-emitting module and the second light-emitting module, and generates a first light-emitting signal and a second light-emitting signal in response to an instruction, to respectively control the first light-emitting module and the second light-emitting module to emit light.

Compared with conventional electronic devices, in the disclosure, light-emitting patterns are formed by using light-emitting ink, so that holes on the housing are omitted, thereby improving integrity of the housing. In addition, in the electronic device of the disclosure, the first light-emitting module and the second light-emitting module are used to provide diversified light emitting effects to meet requirements of users.

DETAILED DESCRIPTION OF THE EMBODIMENTS

More detailed descriptions of the specific embodiments of the disclosure are provided below with reference to the accompanying drawings. The advantages and features of the disclosure are described more clearly according to the following descriptions and claims. It is to be noted that all of the drawings use very simplified forms and imprecise proportions, only being used for assisting in conveniently and clearly explaining the objective of the embodiments of the disclosure.

Figure 1:
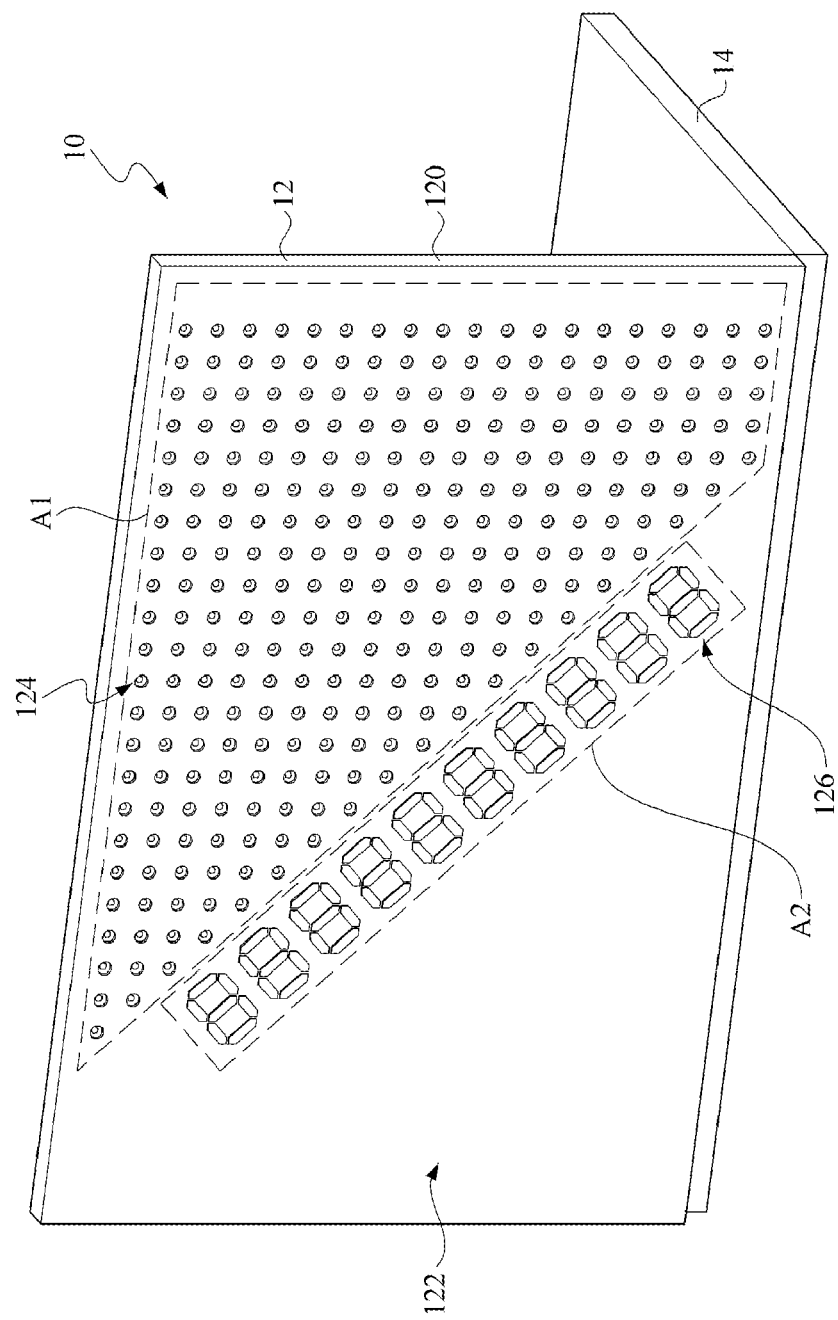
FIG. 1 is a schematic diagram of an appearance of an embodiment of an electronic device according to the disclosure.

FIG. 1 is a schematic diagram of an appearance of an embodiment of an electronic device according to the disclosure. In the figure, a notebook computer is used as an example for describing the disclosure.

As shown in the figure, the electronic device 10 includes a first body 12 and a second body 14. The first body 12 is pivotally connected to the second body 14. In an embodiment, the first body 12 is a screen portion of the electronic device 10, and the second body 14 is a host portion of the electronic device 10.

The first body 12 includes a housing 120, a first light-emitting module 124, and a second light-emitting module 126. The housing 120 includes a surface 122 on a side facing away from the screen (not shown in the figure). The surface 122 includes a first light-emitting region A1 and a second light-emitting region A2. However, the disclosure is not limited thereto. The quantities of the first light-emitting regions A1 and the second light-emitting regions A2 are adjustable according to requirements, to present more diversified light emitting effects.

The first light-emitting module 124 is disposed in the first light-emitting region A1. The second light-emitting module 126 is disposed in the second light-emitting region A2. The first light-emitting module 124 and the second light-emitting module 126 are configured to generate light emitting effects in the first light-emitting region A1 and the second light-emitting region A2.

In an embodiment, the first light-emitting module 124 and the second light-emitting module 126 present patterns or information respectively in the first light-emitting region A1 and the second light-emitting region A2, and the first light-emitting module 124 and the second light-emitting module 126 synchronously present the patterns and the information in the first light-emitting region A1 and the second light-emitting region A2, to help users simultaneously confirm information type and content.

In an embodiment, the first light-emitting module 124 is configured to present a pattern, and the second light-emitting module 126 is configured to present information corresponding to the pattern. In an embodiment, the pattern presented by the first light-emitting module 124 is a phone pattern, and the information presented by the second light-emitting module 126 is information corresponding to the phone pattern such as phone numbers and contacts.

In an embodiment, an area of the first light-emitting region A1 for presenting the pattern is greater than an area of the second light-emitting region A2 for presenting the information, to help the users quickly confirm the information type according to the pattern.

In an embodiment, the first light-emitting region A1 is in the shape of a triangle or a trapezoid (where the trapezoid is taken as an example in the figure), and the second light-emitting region A2 is in the shape of a square. At least two sides of the first light-emitting region A1 are adjacent to an edge of the surface 122, and the first light-emitting region A1 has a bevel edge. The second light-emitting region A2 is adjacent to the bevel edge of the first light-emitting region A1, to help the users simultaneously see the first light-emitting region A1 and the second light-emitting region A2, thereby reading the information content while confirming the information type. However, the disclosure is not limited thereto.

In an embodiment, the second light-emitting region A2 is disposed on the surface 122 outside the first light-emitting region A1. In an embodiment, a position of the second light-emitting region A2 is adjacent to the edge of the surface 122 (such as a lower edge or a left edge shown in the figure), or is located at a corner of the surface 122. In addition, in this embodiment, a direction of the information (such as text or numbers) presented in the second light-emitting region A2 is along the bevel edge of the first light-emitting region A1. However, the disclosure is not limited thereto. In other embodiments, the direction of the second light-emitting region A2 is alternatively along the edge of the surface 122. In an embodiment, the information is presented in a lateral direction or a longitudinal direction.

A notebook computer is used as an example in FIG. 1 for describing the disclosure. However, the disclosure is not limited thereto. The disclosure is alternatively applied to an electronic device having a single body, such as a tablet computer or a smartphone. For the electronic device having a single body, the screen portion and the host portion thereof are integrated in the same body. Compared with the foregoing first body 12, in the body, at least one first light-emitting region A1 and one second light-emitting region A2 are disposed on the surface 122 facing away from the screen, the first light-emitting module 124 is disposed in the first light-emitting region A1, the second light-emitting module 126 is disposed in the second light-emitting region A2, and the associated pattern and information are presented as light emitting effects in the first light-emitting region A1 and the second light-emitting region A2.

Figure 2:
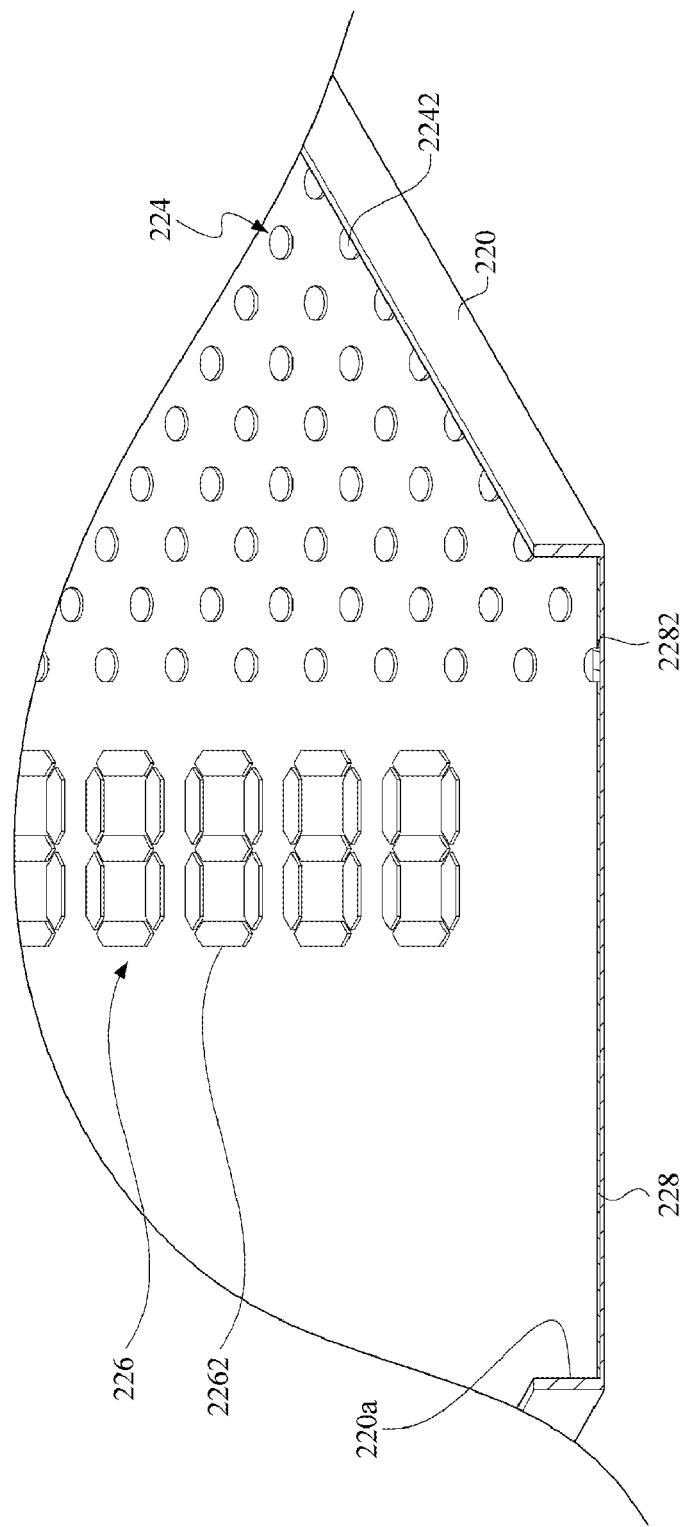
FIG. 2 shows an embodiment of a first light-emitting module and a second light-emitting module by using a partial enlarged view of an inner side of a housing.

FIG. 2 shows an embodiment of a first light-emitting module and a second light-emitting module by using a partial enlarged view of an inner side of a housing. A housing 220 of this embodiment is made of a light-transmissive material.

As shown in FIG. 2, a first light-emitting module 224 and a second light-emitting module 226 are disposed on an inner side of the housing 220, so that an outer side surface of the housing 220 remains flat. The light-transmissive material, in an embodiment, includes glass, acrylic, polycarbonate (PC), and the like.

In an embodiment, the first light-emitting module 224 includes a plurality of first light-emitting units 2242 arranged in an array, and the second light-emitting module 226 includes a plurality of second light-emitting units 2262 arranged in an array. The plurality of first light-emitting units 2242 is formed on an inner side surface 220a of the housing 220. The plurality of second light-emitting units 2262 are also formed on the inner side surface 220a of the housing 220.

In an embodiment, a light-emitting area of the first light-emitting unit 2242 is less than a light-emitting area of the second light-emitting unit 2262 to present more refined patterns.

In an embodiment, the first light-emitting unit 2242 is in the shape of a circle, and the second light-emitting unit 2262 is the shape of a long strip. However, the disclosure is not limited thereto.

In an embodiment, the first light-emitting unit 2242 is in the shape of a symmetric pattern such as a square or a regular triangle. The second light-emitting unit 2262 is in the shape of a circle, a square, or a triangle, and the disclosure is not limited thereto.

In an embodiment, the inner side surface of the housing 220 is covered by a light-shielding layer 228. The light-shielding layer 228 includes a plurality of openings 2282. The first light-emitting units 2242 and the second light-emitting units 2262 are located in the plurality openings 2282.

Figure 3:
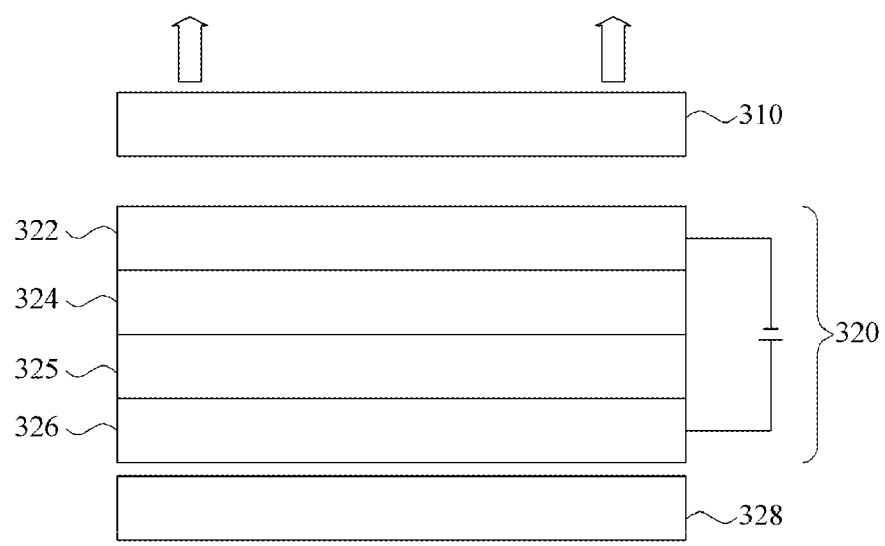
FIG. 3 is a schematic cross-sectional view of a light-emitting ink structure.

Referring to FIG. 3 together, FIG. 3 is a schematic cross-sectional view of a light-emitting ink structure. A light-emitting ink structure 320 is used as a single light-emitting unit inside the foregoing first light-emitting module 224 and the second light-emitting module 226.

As shown in FIG. 3, the light-emitting ink structure 320 is formed on a lower surface of a light-transmissive substrate 310. The light-emitting ink structure 320 includes a first conductive layer 322, a light-emitting ink layer 324, a dielectric layer 325, a second conductive layer 326, and a protective layer 328 from top to bottom. The first conductive layer 322 and the second conductive layer 326 are configured to generate bias voltages inside the light-emitting ink layer 324, to enable the light-emitting ink layer 324 to emit light. In an embodiment, the first conductive layer 322 is a conductive polymeric layer. In an embodiment, the second conductive layer 326 is a metal conductive layer. In an embodiment, the light-emitting ink layer 324 includes a photochromic powder material such as phosphorus powder.

Figure 4:
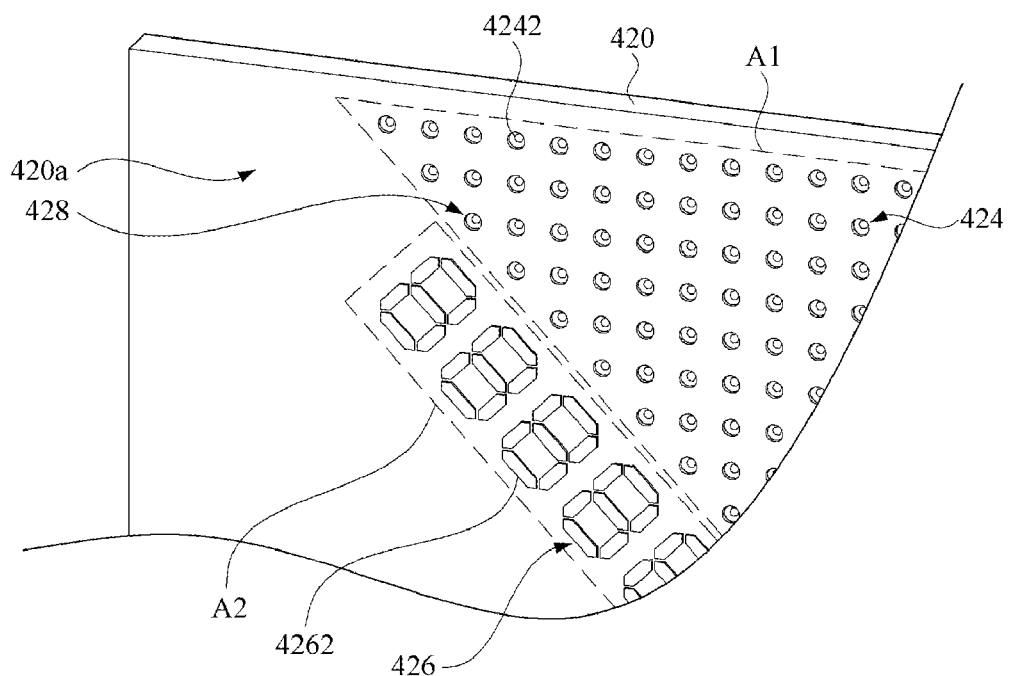
FIG. 4 shows another embodiment of a first light-emitting module and a second light-emitting module by using a partial enlarged view of an outer side of a housing.

FIG. 4 shows another embodiment of a first light-emitting module and a second light-emitting module by using a partial enlarged view of an outer side of a housing. A housing 420 of this embodiment is made of an opaque material.

As shown in FIG. 4, a second light-emitting module 426 is disposed on an outer side surface 420a of the housing 420, a first light-emitting module 424 is disposed on an inner side corresponding to the housing 420, and a second light-emitting region A2 of the housing 420 includes a plurality of through holes 428, so that light generated by the first light-emitting module 424 is transmitted outside through the housing 420. In an embodiment, the opaque material includes metal, ABS resin, a mixture of ABS resin and polycarbonate, carbon fiber, and the like.

Compared with the embodiment in FIG. 2, the second light-emitting module 426 of this embodiment generates a light emitting effect by using light-emitting ink, and the first light-emitting module 424 generates a light emitting effect by using a plurality of light-emitting diodes.

As shown in the figure, the first light-emitting module 424 includes a plurality of light-emitting diodes 4242 arranged on the inner side of the housing 420 in an array. Positions of the plurality of light-emitting diodes 4242 correspond to the through holes 428 on the housing 420.

In an embodiment, as shown in the figure, each light-emitting diode 4242 respectively corresponds to one through hole 428 and is aligned with the through hole 428. However, the disclosure is not limited thereto.

In an embodiment, each light-emitting diode 4242 simultaneously corresponds to a plurality of through holes 428. The plurality of through holes 428 is distributed on the peripheries of a light-emitting direction of each light-emitting diode 4242.

In an embodiment, the second light-emitting module 426 includes a plurality of second light-emitting units 4262 arranged in an array, and the plurality of second light-emitting units is formed on the outer side surface 420a of the housing 420.

In an embodiment, the second light-emitting unit 4262 is in the shape of a circle, a square, or a triangle, and the disclosure is not limited thereto.

The following illustrates how the electronic device 10 of the disclosure controls the first light-emitting module 124 and the second light-emitting module 126 to generate light emitting effects with reference to a schematic block diagram.

Figure 5:
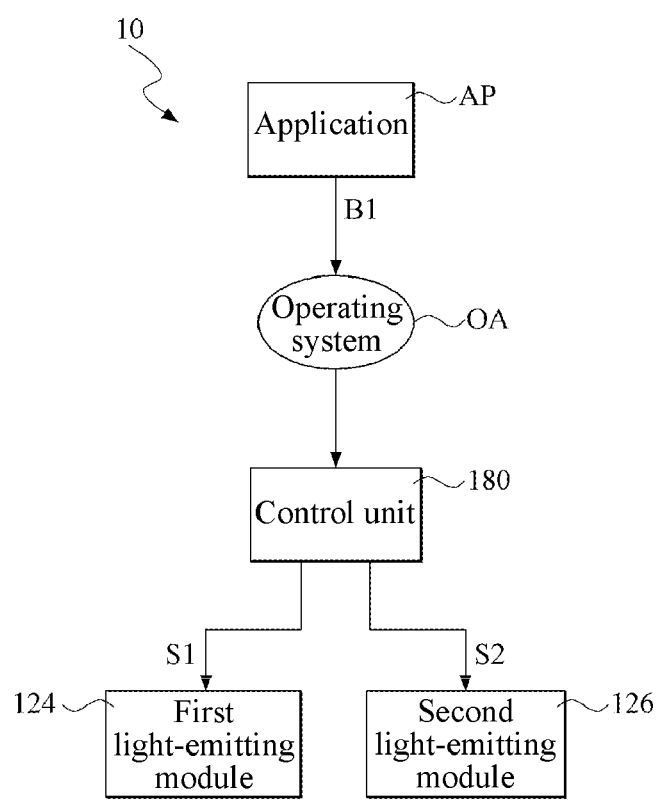
FIG. 5 is a schematic block diagram of the electronic device in FIG. 1.

Referring to FIG. 1 and FIG. 5 together, FIG. 5 is a schematic block diagram of the electronic device 10 in FIG. 1.

As shown in the figure, the electronic device 10 includes a control unit 180, and an application AP is installed in the electronic device 10 by using an operating system OA. The application AP generates an instruction B1 under a preset trigger condition. In an embodiment, if the application AP is phone software, when a call is received, the application AP generates an instruction B1 corresponding to a phonebook function.

The control unit 180 is disposed inside the housing 120 and is electrically connected to the first light-emitting module 124 and the second light-emitting module 126. The instruction B1 generated by the application AP causes the control unit 180 to generate a first light-emitting signal S1 and a second light-emitting signal S2 by using the operating system OA, so that the control unit 180 respectively controls the first light-emitting module 124 and the second light-emitting module 126 to generate light emitting effects.

Figure 6:
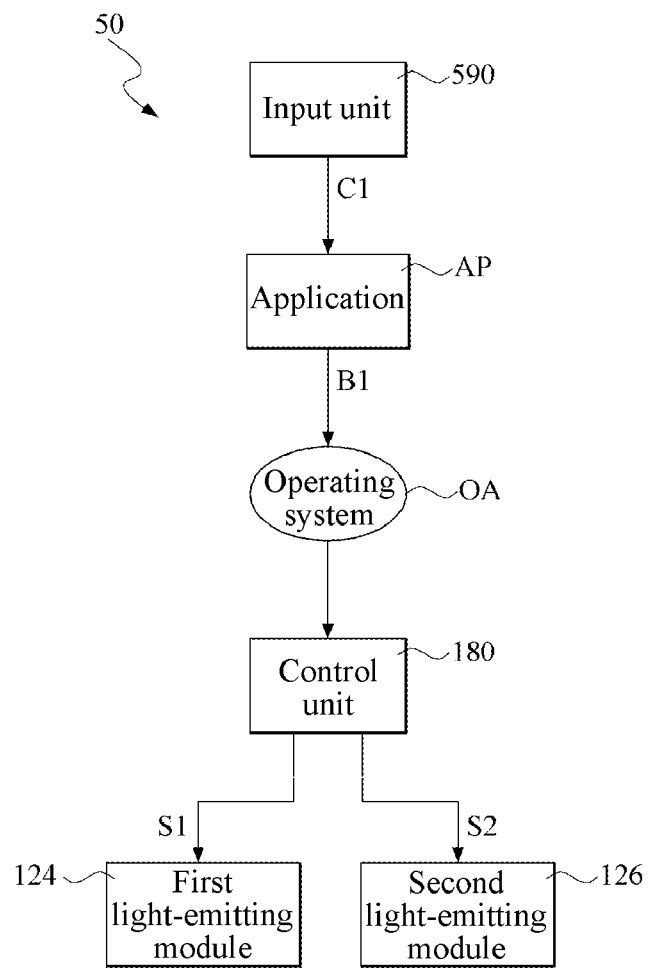
FIG. 6 is a schematic block diagram of another embodiment of an electronic device according to the disclosure.

FIG. 6 is a schematic block diagram of another embodiment of an electronic device according to the disclosure.

Compared with the embodiment in FIG. 5, an electronic device 50 of this embodiment includes an input unit 590. In an embodiment, the input unit 590 includes a keyboard, a touchpad, or a microphone, and is electrically connected to the control unit 180. The input unit 590 receives an input of the user to generate an input signal C1. The application AP generates an instruction B1 in response to the input signal, and the control unit 180 generates a first light-emitting signal S1 and a second light-emitting signal S2 in response to the instruction B1, to respectively control the first light-emitting module 124 and the second light-emitting module 126 to generate light emitting effects.

In an embodiment, if the user chooses or defines a specific pattern by using the input unit 590 (such as a touchpad), the application AP generates an instruction B1 in response to an input signal C1 corresponding to the specific pattern, and the control unit 180 respectively controls the first light-emitting module 124 and the second light-emitting module 126 to generate light emitting effects in response to a first light-emitting signal S1 and a second light-emitting signal S2 generated in response to the instruction B1.

Figure 7:
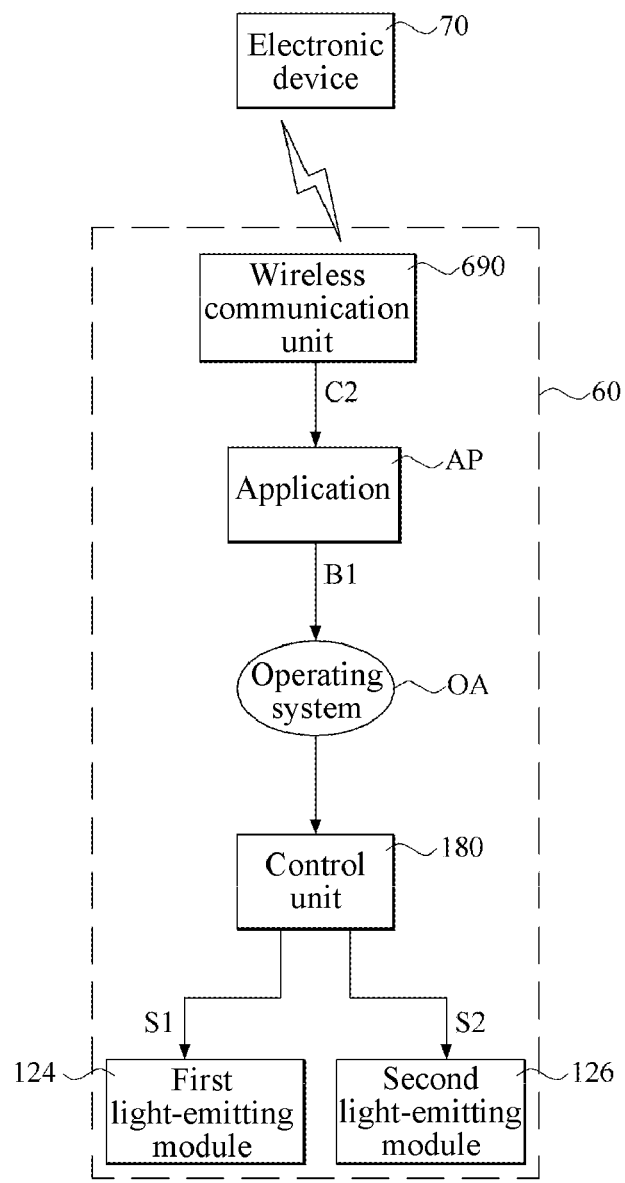
FIG. 7 is a schematic block diagram of still another embodiment of an electronic device according to the disclosure.

FIG. 7 is a schematic block diagram of still another embodiment of an electronic device according to the disclosure.

Compared with the embodiment in FIG. 5, an electronic device 60 of this embodiment includes a wireless communication unit 690. The control unit 180 is electrically connected to the wireless communication unit 690. The wireless communication unit 690 is paired with another electronic device 70 such as a handheld device to receive a wireless signal C2.

The application AP generates an instruction B1 in response to the wireless signal C2 received by the wireless communication unit 690, and the control unit 180 generates a first light-emitting signal S1 and a second light-emitting signal S2 in response to the instruction B1, to respectively control the first light-emitting module 124 and the second light-emitting module 126 to generate light emitting effects.

In an embodiment, the electronic device 60 of this embodiment is paired with a smartphone by the users. The smartphone transmits a wireless signal C2 to the electronic device 60 when receiving a call. Then the electronic device 60 generates an instruction B1 in response to the wireless signal C2, to further control the first light-emitting module 124 and the second light-emitting module 126 to generate light emitting effects.

FIG. 8 to FIG. 11 show four different embodiments of light emitting effects presented by a first light-emitting module 124 and a second light-emitting module 126.

In the embodiments, the first light-emitting module 124 presents a pattern, and the second light-emitting module 126 presents text, symbols, or numbers corresponding to the pattern.

Figure 8:
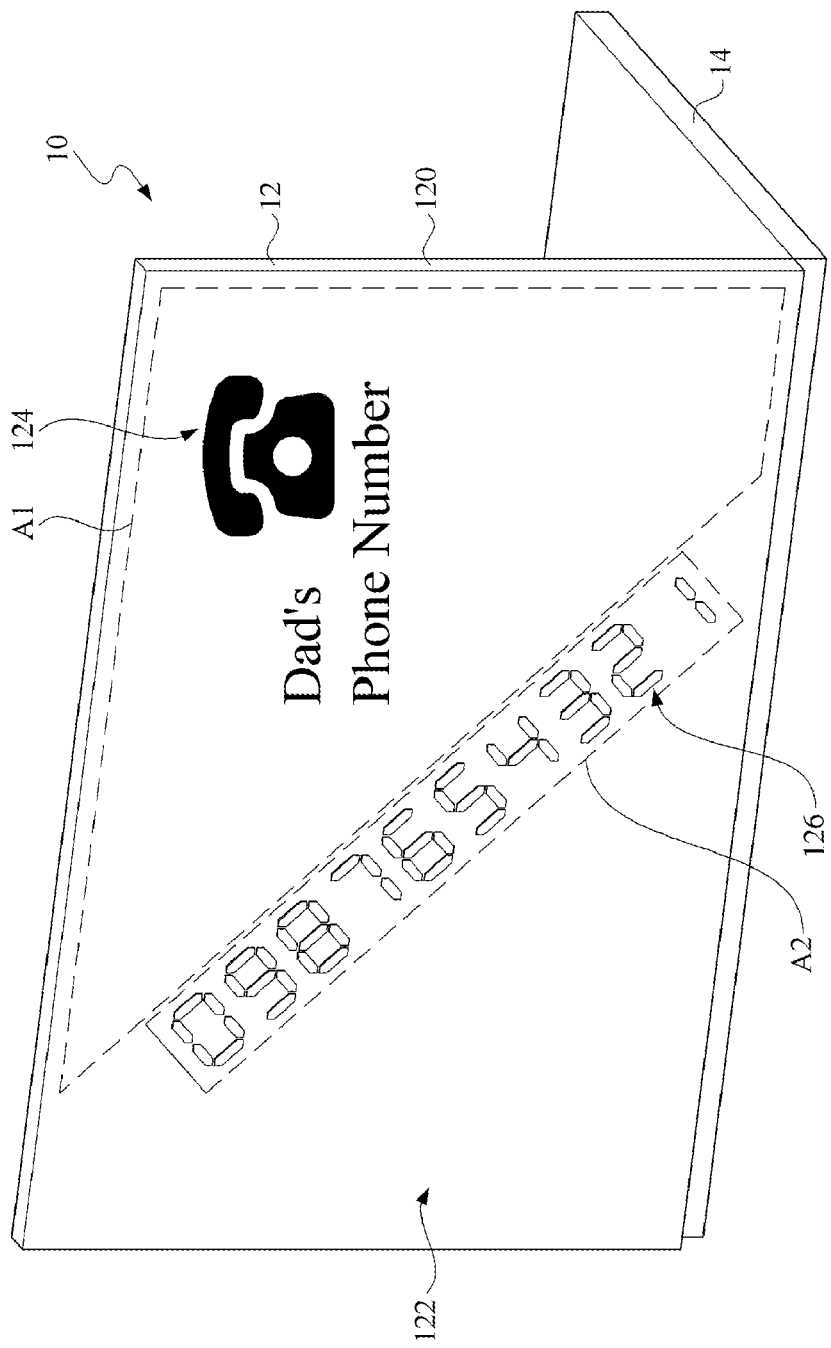
FIG. 8 to FIG. 11 show four different embodiments of light emitting effects presented by a first light-emitting module and a second light-emitting module.

Referring to FIG. 8, if the instruction corresponds to a phonebook function, the control unit 180 generates a first light-emitting signal S1 to control the first light-emitting module 124 to present a phone pattern and call information, and the control unit 180 also generates a second light-emitting signal S2 to control the second light-emitting module 126 to present phone numbers, contacts, and other information associated with the phonebook function. The phone numbers displayed in the figure are taken as an example.

Figure 9:
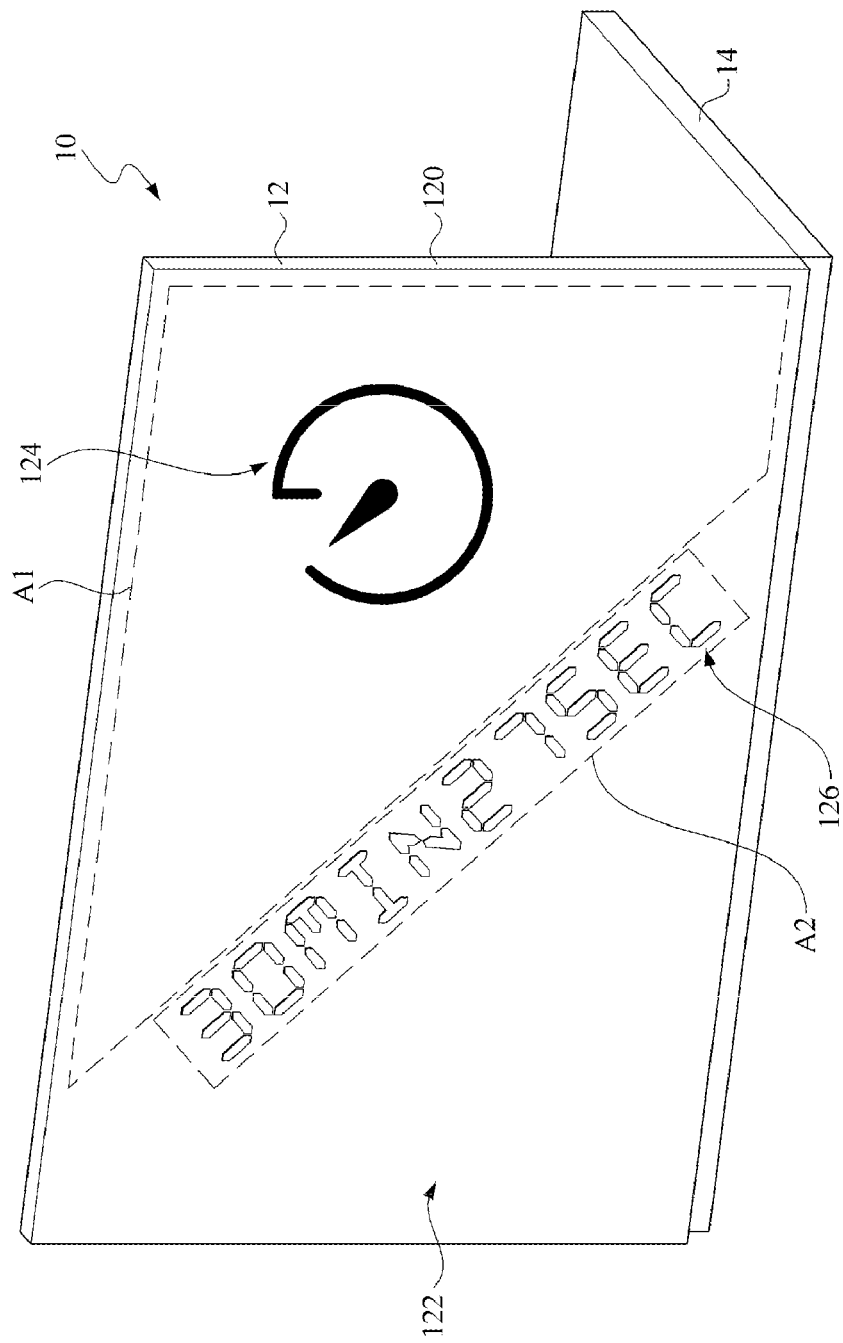

Referring to FIG. 9, if the instruction corresponds to a code table function, the control unit 180 generates a first light-emitting signal S1 to control the first light-emitting module 124 to present a code table pattern, and the control unit 180 also generates a second light-emitting signal S2 to control the second light-emitting module 126 to present time information. In an embodiment, the code table pattern presented by the first light-emitting module 124 is an animation pattern and synchronously changes with the time information presented by the second light-emitting module 126.

Figure 10:
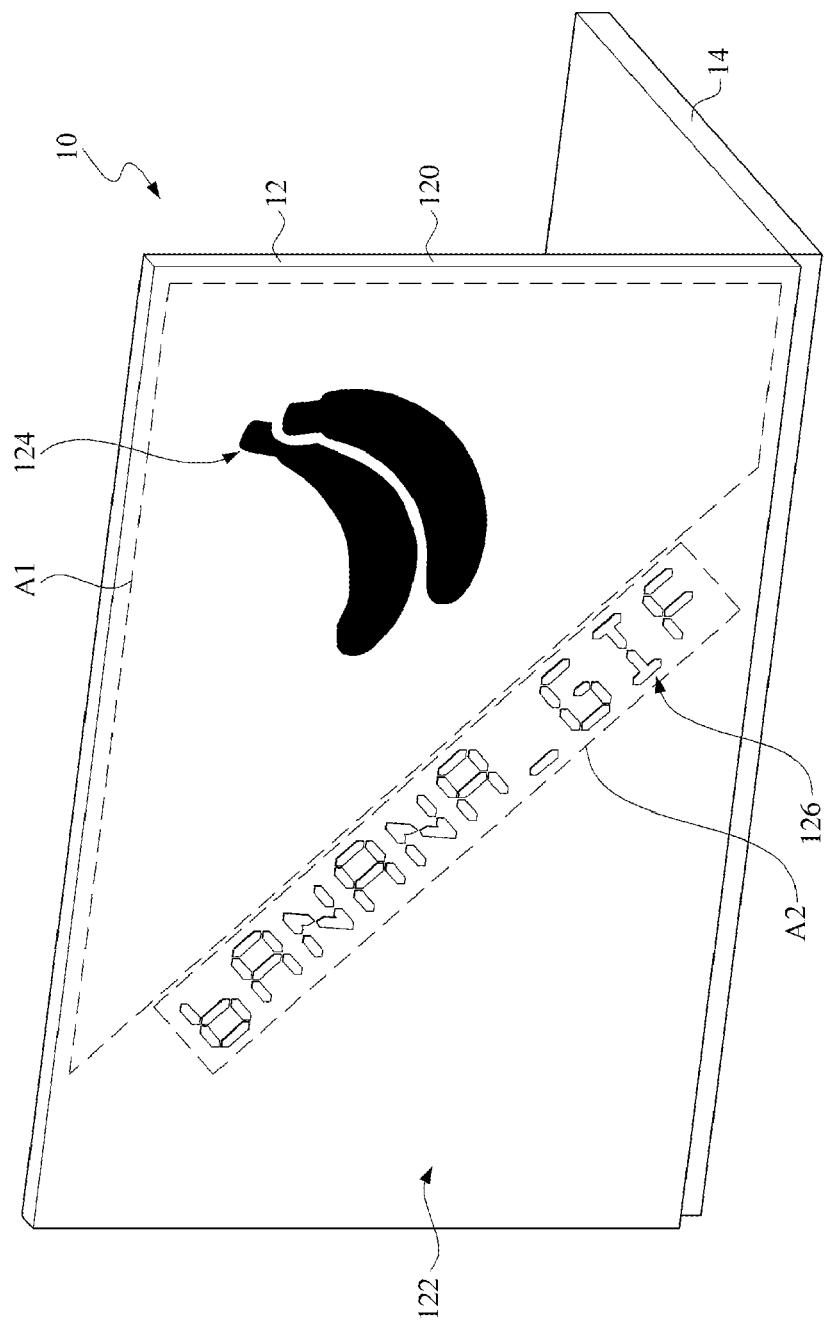

Referring to FIG. 10, if the instruction is associated with pattern selection, the control unit 180 generates a first light-emitting signal S1 to control the first light-emitting module 124 to present a selected pattern (a banana pattern shown in the figure), and the control unit 180 also generates a second light-emitting signal S2 to control the second light-emitting module 126 to present file information corresponding to the selected pattern, in an embodiment, a file name (BANANA.GIF shown in the figure).

Figure 11:
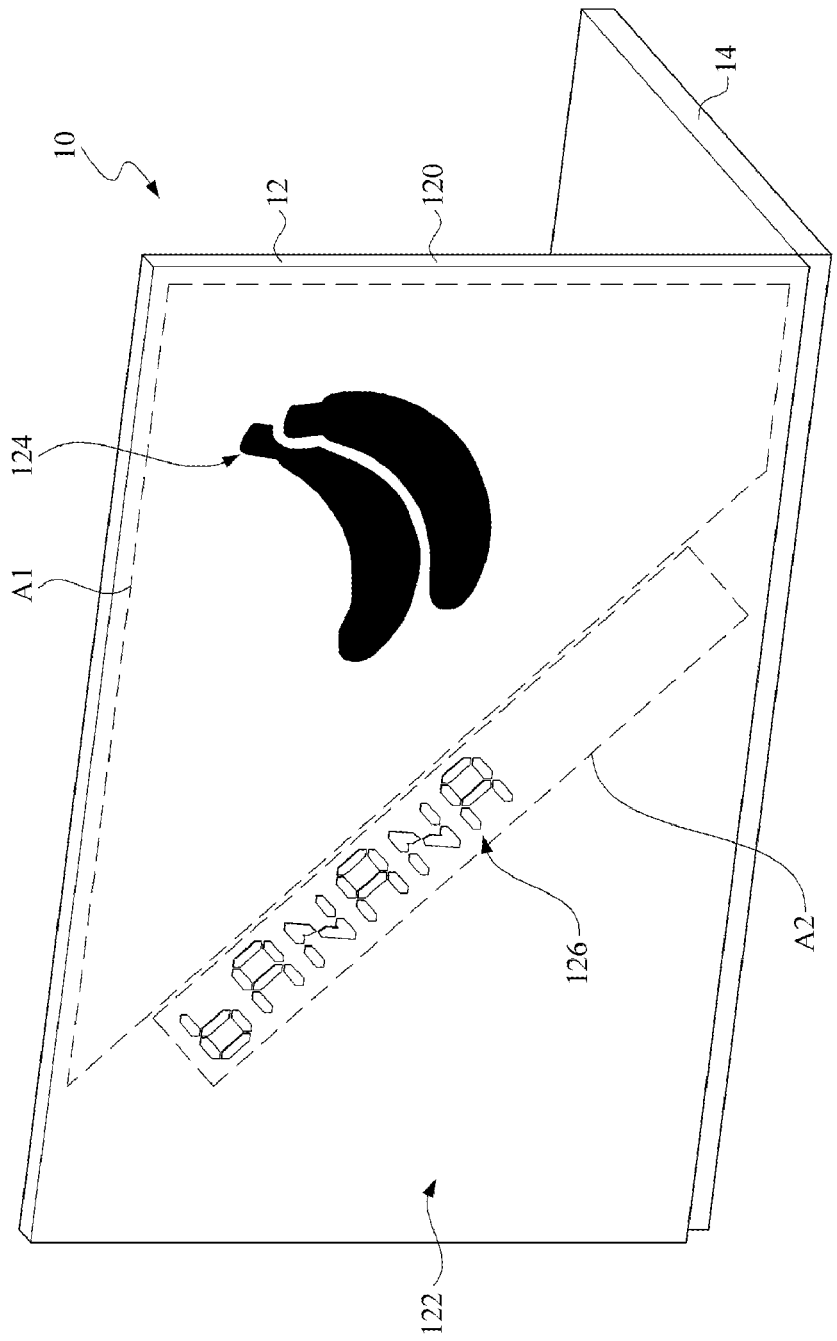

Referring to FIG. 11, if the instruction is associated with a login action, the control unit 180 generates a first light-emitting signal S1 to control the first light-emitting module 124 to present a representative pattern (a banana pattern shown in the figure) corresponding to a login user, and the control unit 180 also generates a second light-emitting signal S2 to control the second light-emitting module 126 to present a login user name (BANANA shown in the figure).

In conclusion, compared with conventional electronic devices needing to form holes on a housing to generate a light emitting effect, in the disclosure, light-emitting ink is directly applied to an outer side surface 420a of a housing 420 to generate light-emitting patterns, or the light-emitting ink is applied to an inner side surface 220a of a housing 220 and is used in combination with a light-transmissive housing to generate light-emitting patterns, so that holes on the housings 120, 220, and 420 are omitted, and the integrity of the appearance of the housing is maintained while providing a light emitting effect.

In addition, the electronic device of the disclosure uses a first light-emitting module 124 and a second light-emitting module 126 to simultaneously generate light emitting effects. The light emitting effects generated by the first light-emitting module 124 and the second light-emitting module 126 provide the users with diversified information to meet requirements of the users.

The above is merely exemplary embodiments of the disclosure, and does not constitute any limitation to the disclosure. Any form of equivalent replacements or modifications to the technical means and technical content disclosed in the disclosure made by a person skilled in the art without departing from the scope of the technical means of the disclosure shall still fall within the content of the technical means of the disclosure and the protection scope of the disclosure.

What is claimed is:

1. An electronic device, comprising:
    a housing, comprising a first light-emitting region and a second light-emitting region;
    a first light-emitting module, comprising a plurality of first light-emitting units arranged in the first light-emitting region in an array, wherein the first light-emitting unit is a light-emitting diode;
    a second light-emitting module, disposed in the second light-emitting region; and
    a control unit, electrically connected to the first light-emitting module and the second light-emitting module and generating a first light-emitting signal and a second light-emitting signal in response to an instruction, to respectively control the first light-emitting module and the second light-emitting module;
    wherein the second light-emitting module comprises a plurality of light-emitting elements;
    wherein the plurality of first light-emitting units and the plurality of second light-emitting units are formed on an inner side surface of the housing;
    wherein the housing includes a plurality of through holes, each of the first light-emitting units respectively corresponds to one of the through holes and is aligned with the corresponding through hole;
    wherein the second light-emitting module comprises a plurality of second light-emitting units in an array;
    wherein the first light-emitting unit is smaller than the second light-emitting unit;
    wherein the second light-emitting unit comprises a light-emitting ink layer;
    wherein each of the second light-emitting units corresponds to a pixel of the second light-emitting module; and
    wherein the electronic device further comprises an application installed therein through an operation system, the application generates the instruction under a preset trigger condition, and the instruction generated by the application causes the control unit to generate the first light-emitting signal and the second light-emitting signal by using the operating system.

2. The electronic device according to claim 1, wherein the housing is made of a light-transmissive material.

3. The electronic device according to claim 1, further comprising a light-shielding layer formed on the inner side surface of the housing, wherein the light-shielding layer comprises a plurality of openings, and the plurality of first light-emitting units is respectively located in the openings.

4. The electronic device according to claim 2, wherein the plurality of second light-emitting units are arranged on the inner side surface of the housing in an array, and a light-emitting area of the first light-emitting unit is less than a light-emitting area of the second light-emitting unit.

5. The electronic device according to claim 1, wherein the housing is made of an opaque material, and the second light-emitting region of the housing comprises the plurality of through holes.

6. The electronic device according to claim 1, wherein an area of the first light-emitting region is greater than an area of the second light-emitting region.

7. The electronic device according to claim 1, further comprising a wireless communication unit electrically connected to the control unit, wherein the wireless communication unit is configured to receive a wireless signal, and the control unit generates the instruction in response to the wireless signal.

8. The electronic device according to claim 1, further comprising an input unit electrically connected to the control unit, wherein the input unit is configured to receive an input signal, and the control unit generates the instruction in response to the input signal.

* * * * *